United States Patent [19]
Ando et al.

[11] Patent Number: 6,089,796
[45] Date of Patent: Jul. 18, 2000

[54] COMPONENT FEEDER

[75] Inventors: Takashi Ando, Kofu; Yoshihisa Naitoh, Yamanashi, both of Japan

[73] Assignee: Matsushita Electric Industrial Co., Ltd., Osaka, Japan

[21] Appl. No.: 09/003,858

[22] Filed: Jan. 7, 1998

[30] Foreign Application Priority Data

Jan. 8, 1997 [JP] Japan ................................. 9-001063

[51] Int. Cl.[7] ................................................ B65G 53/38
[52] U.S. Cl. ........................................... 406/137; 221/163
[58] Field of Search .................................... 221/163, 200, 221/202, 264, 278; 406/137, 136, 138, 88

[56] References Cited

U.S. PATENT DOCUMENTS 4,801,044  1/1989  Kubota et al. .......................... 221/163

FOREIGN PATENT DOCUMENTS 2326874  6/1999  United Kingdom .

*Primary Examiner*—Kenneth W. Noland
*Attorney, Agent, or Firm*—Price Gess & Ubell

[57] ABSTRACT

A component feeder being capable of supplying flat and minute components stably and rapidly. The component feeder comprises an agitation room 111 in which the components 102 are stirred by air, and a component conveying path 113 connected to the front of the agitation room 111 into which the components 102 of certain posture are blown, where they are aligned and transferred by air toward a given component feeding position. When the component 102 has the dimensions of l>w>t where l is the length, w is the width, and t is the thickness, the horizontal width D of a front part 111c of the agitation room 111 nearest to the component conveying path 113 as well as of an opening of the component conveying path 113 connecting to the agitation room 111 is set to be w>D>t

8 Claims, 8 Drawing Sheets

COMPONENT FEEDER

BACKGROUND OF THE INVENTION

1. Technical Field of the Invention

The present invention relates to a component feeder which supplies components used for various purposes such as minute electronic components mounted on a printed circuit board by stirring and blowing the components into a component conveying path with an air blow, where the components are aligned and transferred toward a given component feeding position.

2. Description of Related Art

For mounting electronic components on a printed circuit board, a multiplicity of components need to be fed at a high speed. One of the conventional electronic component feeders which supply a great number of minute electronic components at a high speed is constructed as described below. The component feeder utilizes a tape-like component assembly comprising a tape-like member, having a multiplicity of holding recesses thereon provided in one line and opened at one side, in each of which a component is encased and closed with a cover tape. The tape-like component assembly is reeled out at a given pitch while the cover tape is peeled off to open each holding recess at a component feeding position so as to allow the component in the holding recess to be taken out by a suction nozzle.

Also known as an alternative is an even simpler method in which the components agitated by air are blown into a path where they are aligned to be fed to a given feeding position.

FIG. 1 shows a mounting apparatus A in which a component feeder B of the latter type is incorporated. The apparatus A is designed for mounting electronic components 102 onto a printed board 101. The component feeder B loaded with the electronic components 102 needed in the apparatus A is mounted on a feeder table 103 beside the mounting apparatus A. Each time it is desired to mount a given type of components, the component feeder B accommodating the desired type of components is moved to a position opposite to the mounting apparatus A.

A component 102 supplied from the component feeder B is picked up by a nozzle 105 by suction which is disposed to a mounting head 104 of the apparatus A, and placed on the a printed board 101. The printed board 101 is held on an X-Y table 106 which is adjustable along X and Y directions, so that the component 102 picked up and transferred by the nozzle 105 can be precisely mounted to a predetermined position on the board 101.

The component feeder B is constructed as described below. Components 102 are replenished into an agitation room 111 from a bulk cassette 112 which is detachably connected to the agitation room 111. The components 102 are stirred in the agitation room 111 by air supply, sent out into a component conveying path 113 which leads out of the agitation room 111. Finally, the components 102 are aligned in the component conveying path 113 and transferred by air to a component feeding position 114.

The top side of the component conveying path 113 is opened at the component feeding position 114, so that the components 102 conveyed thereto can be taken out. A shutter 115 is provided at the opened portion of the path 113. A pusher 116 is provided for pressing down a lever 117 on the component feeder B which causes the shutter 115 to open, at the time when the component 102 which has been transferred to the feeding position 114 is picked up by the nozzle 105.

One drawback of such component feeder B as described above is that there is rather little probability that the components 102 are successfully sent out from the wide agitation room 111 into the narrow component conveying path 113 in such a way that the components 102 can be aligned in one line facing to a specific direction within the component conveying path 113 by merely stirring the components in the wide agitation room 111, thus being unable to accommodate the growing needs for operating the mounting apparatus A at a higher speed in recent years.

It has been thus devised in the prior art that the air 1$a$ is blown up obliquely toward the back side from a plurality of points at the bottom at the front and back sides in the agitation room 111 to agitate the components 102 actively, in order to prevent the narrower part of the room 111 from clogging up with the components 102 and to increase the probability of causing the components 102 to be sent into the component conveying path 113 facing to a given direction. Also, in the component conveying path 113, the air 1$a$ is blown obliquely toward the front from a plurality of points at the bottom, so that the components 102 sent into the path 113 can be smoothly transferred to the component feeding position 114 in a line.

The opening which leads to the narrow component conveying path 113 is disposed at a lower part of a front wall of the agitation room 111 which has great width and height, where the components 102 agitated by the air 1a tend to accumulate, pile up one upon another, or traverse and block the opening, being a hindrance to the smooth transfer of the components 102 into the path 113 or causing the path 113 to be clogged up with the components 102.

To avoid such trouble, it has already been devised to construct the agitation room or chamber 111 to have three parts: a rear part 111$a$, an intermediate part 111$b$, and a front part 111$c$, the size of which reduces stepwise, from the bulk cassette 112 side toward the component conveying path 113 side, as shown in FIG. 2. Provided that the component 102 has substantially a square cross section with the equal width w and height w and a given length l (w<l) as shown in FIG. 4, it is prevented that the components 102 accumulate on each other at the front wall 111$d$ of the front part 111$c$ of the agitation room 111 by setting the horizontal width W of the front room 111$c$ to be w<W<l, as shown in FIG. 3.

If the component 102 is of a flat shape having a length l, width w and a thickness t (l>w>t) as shown in FIG. 13, its width being different from the thickness, the mouth of the component conveying path 113 opened in the front wall 111$d$ of the front room 111$c$ is set to have the width W (w<W<l) as mentioned above and the height T, which is determined to be t<T<w as shown in FIG. 5.

In such an arrangement, however, the components 102 agitated by air and accumulated around the opening at the lower part of the front wall 111$d$ of the front part 111$c$ tended to stand substantially at right angles with respect to the configuration of the opening of the component conveying path 113 with their widthwise or lengthwise side vertical, and in parallel to each other as shown in FIGS. 6A and 6B. There was thus still little probability of sending the components 102 in a posture as shown in FIG. 5 into the opening of the component conveying path 113, leading to the problem that the component feeder is incapable of feeding components 102 reliably and rapidly, thus being unable to accommodate a further speedup of the component mounting operation.

BRIEF SUMMARY OF THE INVENTION

In view of the foregoing, it is a primary object of the present invention to provide a component feeder which is capable of feeding flat components stably and expeditiously, of which width and thickness is different from each other.

The component feeder of the present invention comprises: an agitation room in which components are stirred with an air blow; a component conveying path connected to the front of the agitation room into which the components facing to a specific direction are blown in, for aligning and transferring the components toward a given component feeding position; and an air supplying means for supplying the air into the agitation room and the component conveying path; in which a horizontal width of the agitation room at a part nearest to the component conveying path as well as an opening of the component conveying path communicating to the agitation room is set to be w>D>t, when the component has dimensions of l>w>t, where l is a length, w is a width, and t is a thickness of the component. Even if the components are of flat type having such dimensions as described above, the components are prevented from taking a lateral posture traversing and blocking the opening of the component conveying path, increasing the probability of causing the component to take a desired posture to be sent into the path.

Also, the component conveying path is configured to be spiral for guiding the components within a space in the path in such a way that the posture of the components are adjusted at a given angle before reaching the component feeding position. The component can be adjusted to have a desired posture before reaching the pickup position irrespective of its posture at the time when sent from the agitation room into the component conveying path.

Other and further objects, features and advantages of the invention will appear more fully from the following description.

DETAILED DESCRIPTION OF THE INVENTION

One embodiment of the present invention will be hereinafter described referring to FIGS. 7 to 13.

Figure 1:
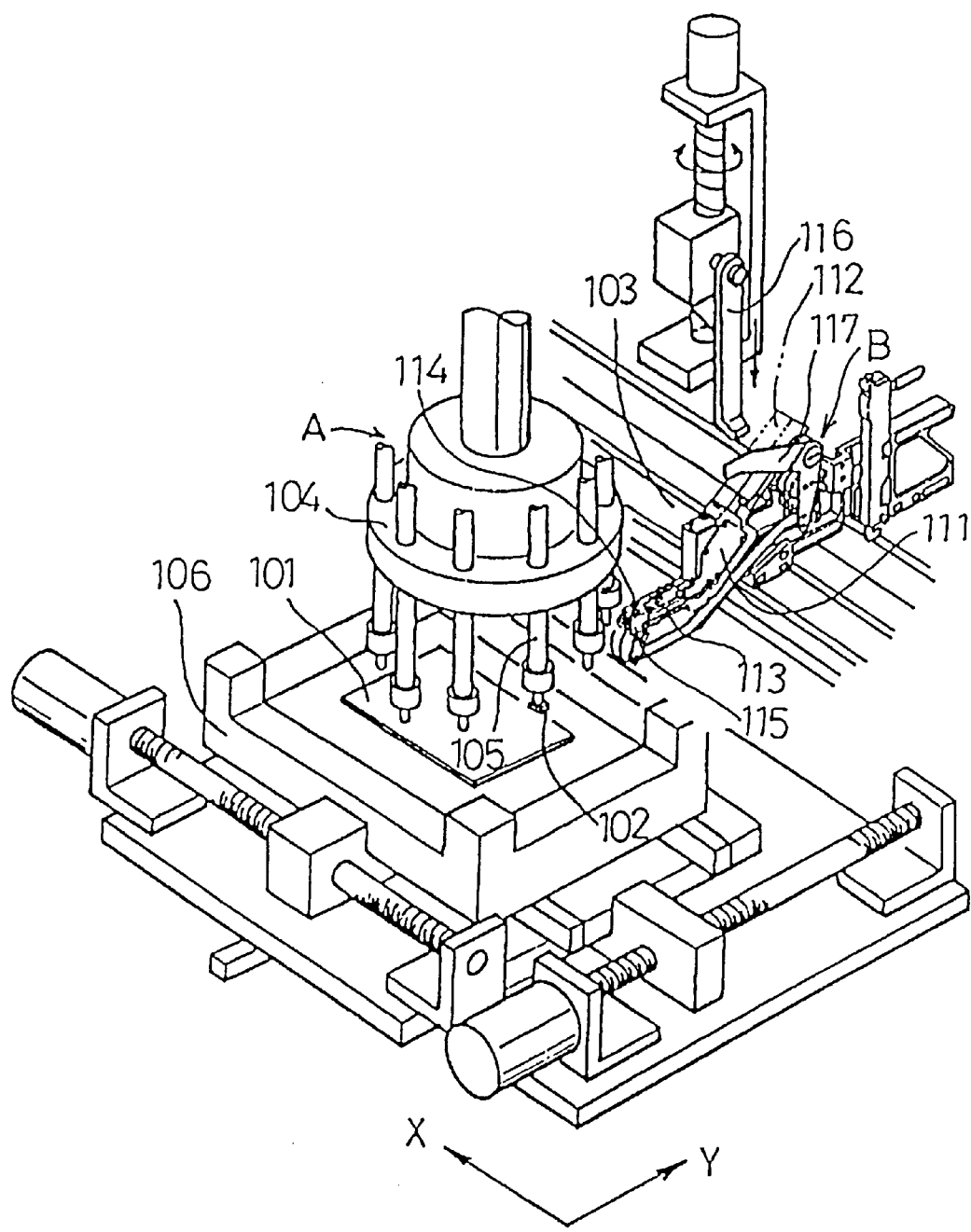
FIG. 1 is a schematic perspective view showing the entire structure of a prior art component feeder and a mounting apparatus.
Figure 2:
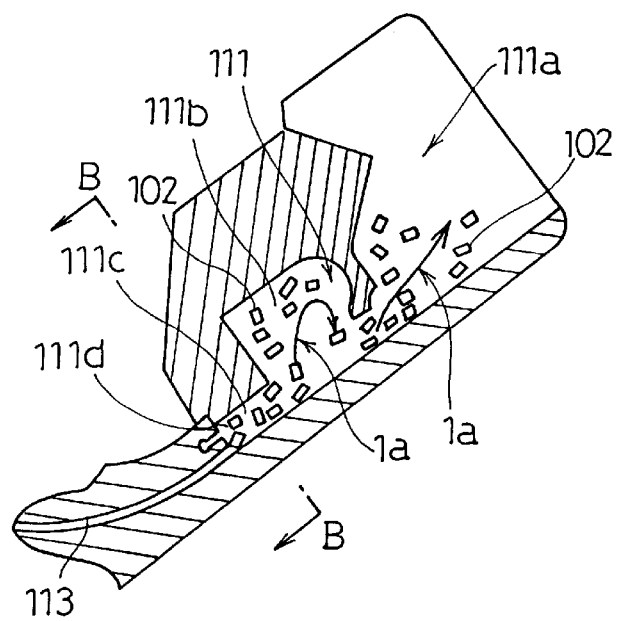
FIG. 2 is a longitudinal sectional front view showing an improved agitation room devised for the component feeder of FIG. 1.
Figure 3:
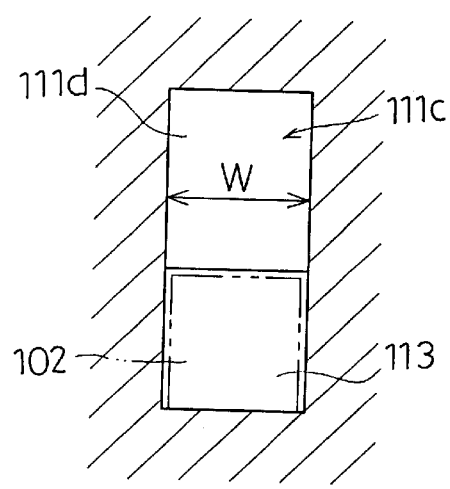
FIG. 3 is an enlarged sectional view taken in the direction of the arrows along the line B—B in FIG. 2.
Figure 4:
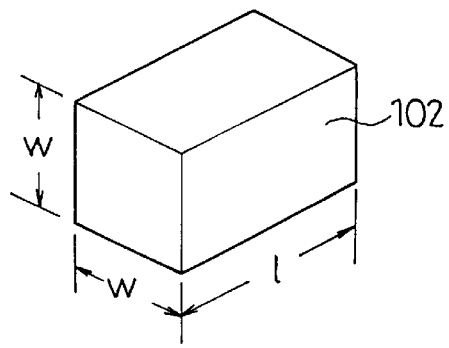
FIG. 4 is a perspective view of a component applied to the prior art of FIG. 1.
Figure 5:
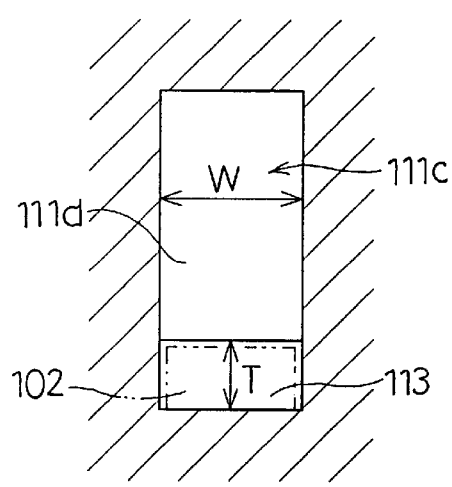
FIG. 5 is an enlarged sectional view similar to FIG. 3 showing a front part of the agitation room when the components are flat type components.
Figure 6A:
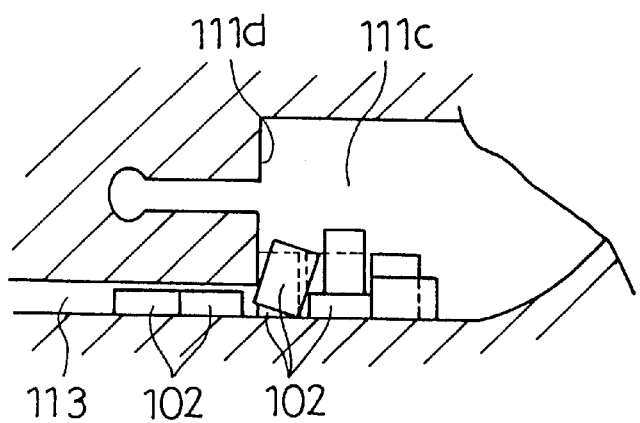
FIG. 6A is a longitudinal front view.
Figure 6B:
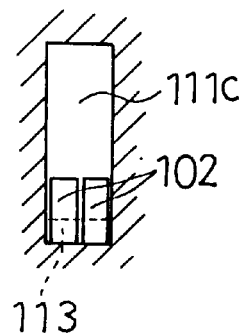
FIG. 6B is a longitudinal side view of FIG. 6A, both showing a state of components when the components are stirred in the agitation room of FIG. 5.

The entire structure of the component feeder B of this embodiment and the mounting apparatus A in which the component feeder B is incorporated is substantially the same as the prior art described with reference to FIG. 1, and thus will not be explained in detail.

Figure 13:
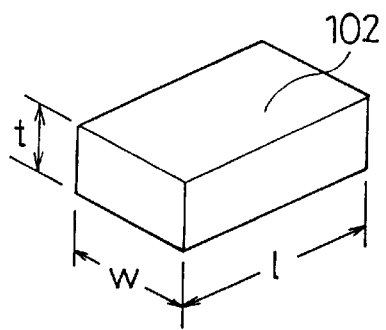
FIG. 13 is a perspective view of a component applied to the embodiment.

The component feeder B of this embodiment is designed to feed flat type components 102 having a different width and thickness as shown in FIG. 13, its dimensions being l>w>t (l=length, w=width, t=thickness).

Figure 7:
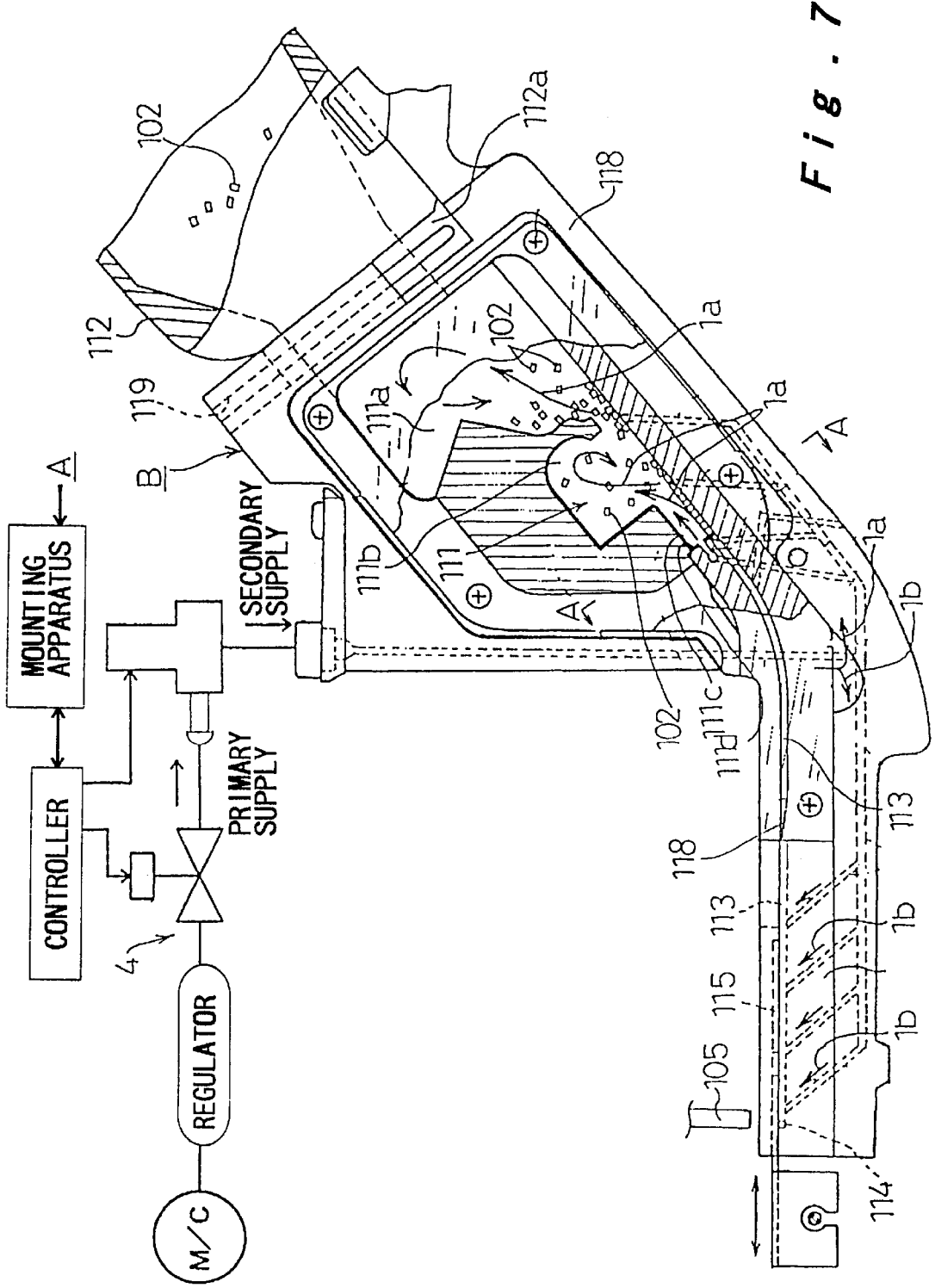
FIG. 7 is a fragmentary sectional view showing a part of one embodiment of the component feeder according to the present invention.

FIG. 7 shows the component feeder assembly B of this embodiment which comprises an agitation room 111 in which the components 102 are stirred with jets of air 1a blown obliquely to the back side, a component conveying path 113 connected to the front of the agitation room 111 into which some of the components 102 facing to a given direction are blown, and in which the components 102 are aligned in one line and transferred to a predetermined feeding position 114 by jets of air 1b blown out obliquely to the front side, and an air supply means 4 for causing the jets of air 1a, 1b to be blown out into the agitation room 111 and the component conveying path 113.

The components 102 are stirred with air 1a in the agitation room 111, some of which are facing to a preferred given direction and are sent out into the component conveying path 113 and transferred with the air 1b to the feeding position 114, where they are picked up by a suction nozzle 105 for use.

Figure 8:
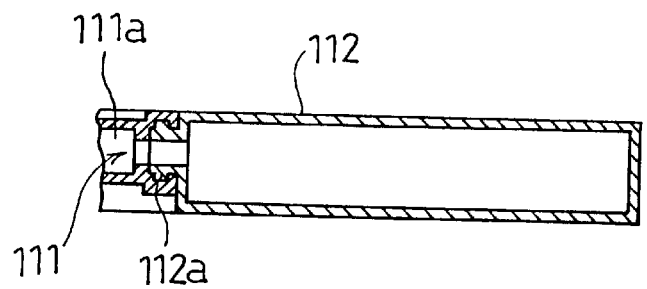
FIG. 8 is a sectional plan view showing a mounting portion of a bulk cassette in the embodiment.

A bulk cassette 112 is detachably connected to the agitation room 111 as shown in FIGS. 7 and 8 for replenishment of the components 102. More specifically, a mouth 112a of the bulk cassette 112 is detachably coupled from above to a dovetail groove formed in a main body 118 at the back side of the agitation room 111, so as to communicate with the agitation room 111. The bulk cassette 112 is so configured that it allows the components 102 accommodated therein to flow down into the agitation room 111 due to its own reclining posture when connected to the agitation room 111.

The agitation room 111 is configured to be reduced in size stepwise from the back side where the bulk cassette 112 is connected toward the front side which leads to the component conveying path 113. The components 102 agitated in a larger rear part 111a are led through an intermediate part 111b to a smaller front part 111c, being reduced in number, from where they are smoothly sent out into the component conveying path 113.

Figure 9:
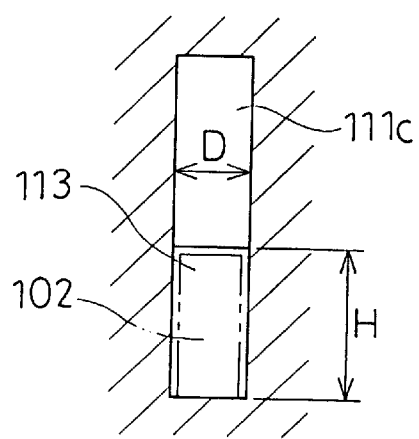
FIG. 9 is an enlarged sectional view taken in the direction of the arrows along the line A—A in FIG. 7.

In this embodiment, the smallest front part 111c of the agitation room 111 is designed to have a width D in a horizontal direction being slightly larger than the thickness t of the component 102 but smaller than the width w of the same as shown in FIG. 9. The opening which leads into the component conveying path 113 from the front part 111c has the same width D as that of the front part 111c and the height H being slightly larger than the width w of the component 102.

Figure 10A:
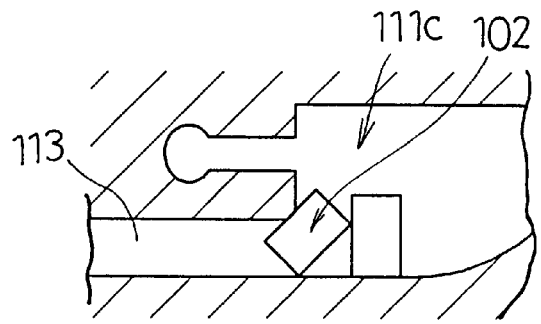
FIGS. 10A–10D are explanatory views showing each state of components when the components are stirred in a front part of the agitation room in the embodiment.
Figure 10B:
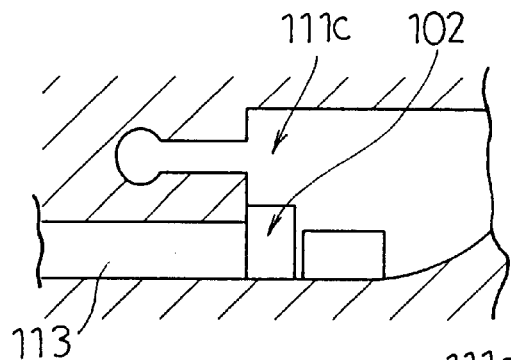
Figure 10C:
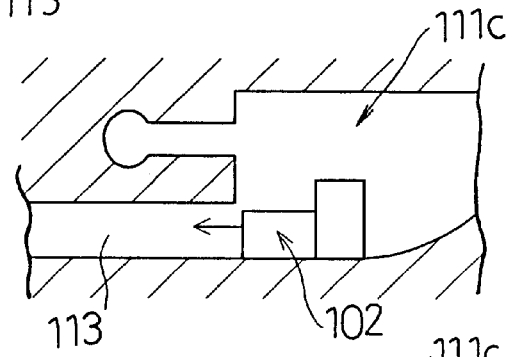
Figure 10D:
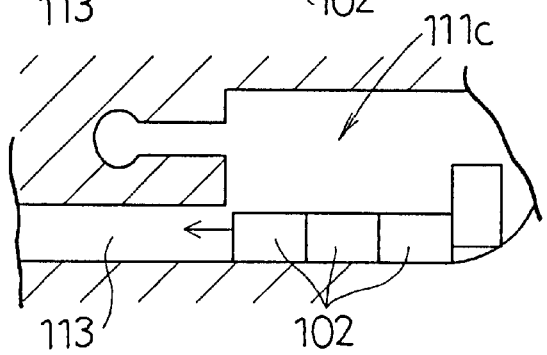

Consequently, the components 102 stirred in the agitation room 111 and blown into the front part 111c in various postures fall into three types according to their angles as shown in FIGS. 10A–10C. As can be seen, the component 102 in a state as shown in FIG. 10C can only be forwarded into the component conveying path 113, and thus it is assumed that the probability that the components 102 are sent into the path in one rotation of agitation is at least more than one third. It is, however, of course likely that the components 102 are not sent in for various reasons more than three times, or three or more components may be successively sent in as shown in FIG. 10D.

It is thus possible to send the components 102 into the component conveying path 113 in one rotation of agitation with the air 1a at a higher probability, thereby feeding the components 102 to the feeding position 114 at a high speed and uninterruptedly.

If the component 102 is transferred to the feeding position 114 in the same posture standing on its side as it has been sent in from the agitation room 111 into the path 113, the side along the direction of its thickness comes upward. In case that the side along the direction of its width needs to be placed on a substrate such as the printed circuit board 101, another process of changing the posture of the component by 90 degrees will be necessary after being attracted by the suction nozzle 105.

Figure 11:
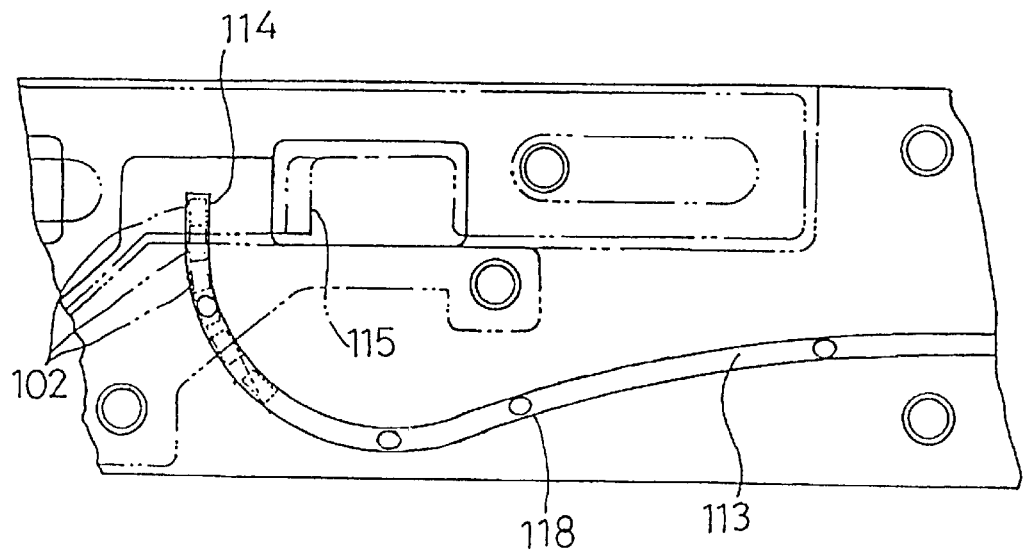
FIG. 11 is a plan view showing a component conveying path in the embodiment.
Figure 12:
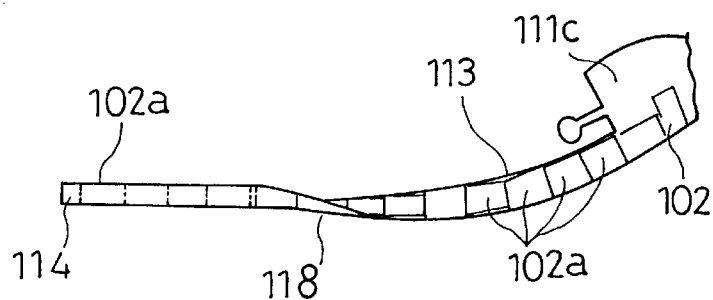
FIG. 12 is a model view showing the component conveying path comprised of a spiral path in the embodiment.

For that reason, the component conveying path 113 in this embodiment comprises a spiral path 118 which is formed to be spirally curved in three dimensions as shown in FIGS. 11 and 12, so as to cause the component 102 standing upright when it has been sent into the path 113 to be substantially horizontal at the feeding position 114, bringing the pickup surface 102a upward.

Accordingly, the component conveying path 113 allows the components 102 to be flown thereinto at a maximum probability, while readily converting the posture of the components 102 suitable for being picked up at the feeding position 114 by the suction nozzle 105 and mounted on the printed circuit board 101. It is thus quite advantageous to apply the present invention to a case in which it is desired to mount flat components 102 having a rectangular cross section with the direction of their thickness vertical to the printed board 101.

Although the present invention has been fully described by way of examples with reference to the accompanying drawings, it is to be noted that various changes and modifications will be apparent to those skilled in the art. Therefore, unless otherwise such changes and modifications depart from the scope of the present invention, they should be construed as being included therein.

What is claimed is:

1. A component feeder comprising:

an agitation room in which components are stirred with an air blow;

a component conveying path connected to the front of the agitation room into which the components facing to a specific direction are blown in, for aligning and transferring the components toward a given component feeding position; and an air supply means for supplying the air into the agitation room and the component conveying path; in which a horizontal width of the agitation room at a part nearest to the component conveying path as well as an opening of the component conveying path communicating to the agitation room is set to be w>D>t, where D is the horizontal width of the agitation room at the part nearest to the component conveying path, when the component has dimensions of l>w>t, where l is a length, w is a width, and t is a thickness of the component.

2. A component feeder according to claim 1, in which the component conveying path is configured to be spiral for guiding the components within a space in the path in such a way that the posture of the components are adjusted at a given angle before reaching the component feeding position.

3. A component feeder for providing a plurality of components to be mounted onto a substrate including an agitation chamber for stirring the components and a component conveying path connected to the agitation chamber by an opening that is dimensioned to pass the components in a predetermined alignment for passage along the component conveying path, the improvement comprising:

the opening of the component conveying path having a height slightly larger than w and a width slightly larger than t wherein the component has dimensions of a length, l, a width, w, and a thickness, t, and these dimensions satisfy the following condition:

$$l>w>t;$$

wherein the agitating chamber includes a front end portion connected to the opening of the conveyor path having a horizontal width, D, equal to the width of the opening of the conveying path that satisfies the following condition:

$$w>D>t.$$

4. The invention of claim 3 wherein the component conveying path has an exit opening of a height slightly larger than t and a width slightly larger than w.

5. The invention of claim 3 wherein the component conveying path is curved to alter the predetermined entrance alignment of the components.

6. The invention of claim 3 wherein the component conveying path has an exit opening of a height slightly larger than t and a width slightly larger than w.

7. A component feeder assembly for providing a plurality of components at a relatively high speed and a predetermined alignment to a pickup position for automatic mounting on a printed circuit board comprising:

an agitation chamber for receiving a plurality of components;

a force applying system to agitate and cause the components to tumble in the agitation chamber to encourage a predetermined alignment of the components as they exit the agitation chamber; and a component conveying path connecting the agitation chamber to the pickup position, the component conveying path having an opening into the agitation chamber with a height slightly larger than w and a width slightly larger than t wherein the component has dimensions of a length, l, a width, w, and a thickness, t, and these dimensions satisfy the following condition:

$$l>w>t;$$

wherein the agitating chamber includes a front end portion connected to the opening of the conveyor path having a horizontal width, D, equal to the width of the opening of the conveying path that satisfies the following condition:

$$w>D>t.$$

8. The invention of claim 7 wherein the component conveying path is curved to alter the predetermined entrance alignment of the components.

* * * * *